(12) United States Patent
Kitamoto et al.

(10) Patent No.: US 12,122,669 B2
(45) Date of Patent: Oct. 22, 2024

(54) METHOD OF MANUFACTURING LAMINATE

(71) Applicant: Enplas Corporation, Saitama (JP)

(72) Inventors: Ken Kitamoto, Saitama (JP); Ryoya Nakamura, Saitama (JP)

(73) Assignee: Enplas Corporation, Saitama (JP)

( * ) Notice: Subject to any disclaimer, the term of this patent is extended or adjusted under 35 U.S.C. 154(b) by 253 days.

(21) Appl. No.: 17/695,889

(22) Filed: Mar. 16, 2022

(65) Prior Publication Data
US 2023/0294979 A1   Sep. 21, 2023

(51) Int. Cl.
*B81C 1/00* (2006.01)

(52) U.S. Cl.
CPC .... *B81C 1/00071* (2013.01); *B81C 2201/034* (2013.01)

(58) Field of Classification Search
CPC ............. B81C 2201/034; B81C 1/00071
See application file for complete search history.

(56) References Cited

U.S. PATENT DOCUMENTS

| | | | |
|---|---|---|---|
| 6,757,455 B1 * | 6/2004 | Kamijima | B81C 1/00182 385/16 |
| 2002/0001695 A1 * | 1/2002 | Tajima | B81C 1/00071 428/188 |
| 2020/0094249 A1 * | 3/2020 | Chiba | B01J 19/00 |
| 2021/0129535 A1 * | 5/2021 | Yamada | B41J 2/1635 |
| 2021/0276241 A1 * | 9/2021 | Crivelli | B81B 1/006 |

FOREIGN PATENT DOCUMENTS

| | | | | |
|---|---|---|---|---|
| CN | 107878028 B | * | 10/2020 | ............... B41J 2/14 |
| JP | 2019-042829 A | | 3/2019 | |

OTHER PUBLICATIONS

Definition of Aspect Ratio: https://calculateaspectratio.com/aspect-ratio (Year: 2022).*
Machine translation CN107878028B (Year: 2020).*

* cited by examiner

*Primary Examiner* — Jacob T Minskey
*Assistant Examiner* — Ayne K. Swier
(74) *Attorney, Agent, or Firm* — Shih IP Law Group, PLLC

(57) ABSTRACT

A manufacturing method capable of manufacturing a laminate including a substrate having a recess and a film with a high yield is provided. The method of manufacturing a laminate of the present invention includes: preparing a substrate having a recess; disposing a film on the substrate so as to cover the recess; and obtaining a laminate by thermocompression bonding between the film and the substrate by pressing the film and the substrate with a first elastic body and a second elastic body in a state in which the substrate on which the film is disposed is disposed between the first elastic body and the second elastic body such that the film is on the first elastic body side, in which the first elastic body is harder than the second elastic body.

5 Claims, 3 Drawing Sheets

US 12,122,669 B2

METHOD OF MANUFACTURING LAMINATE

TECHNICAL FIELD

The present invention relates to a method of manufacturing a laminate.

BACKGROUND ART

In recent years, in order to analyze minute amounts of substances such as proteins and nucleic acids with high accuracy and at high speed, a channel device (channel chip) has been used. Such a channel device is often manufactured as a laminate. That is, the channel device is often manufactured as a laminate including a resin substrate and a resin film bonded to the resin substrate. Specifically, a recess is formed in the substrate, and a channel or a container for a fluid is formed in the channel chip by bonding the film to the substrate so as to cover the recess. Advantageously, the channel chip is easily manufactured and requires only a small amount of reagents and samples for the analysis, and is thus expected to be used in various applications such as clinical tests, food tests, and environmental tests. For example, PTL 1 discloses a manufacturing method of manufacturing a micro channel chip (channel device) as a laminate by thermocompression bonding.

CITATION LIST

Patent Literature

PTL 1

Japanese Patent Application Laid-Open No. 2019-42829

SUMMARY OF INVENTION

Technical Problem

In the manufacture of laminates such as channel devices (channel chips), it is important to manufacture a laminate with high yield. Examples of causes of a defective product in the case of manufacturing the laminate by bonding a film to a substrate having a recess as described above by thermocompression bonding include insufficient bonding between the substrate and the film due to deformation of the substrate, unintentional thermocompression bonding between a bottom portion of a shallow recess and the film, and the like. The thermocompression bonding between the bottom portion of the recess and the film causes a channel and a container to be blocked, thus causing a defective product. From the viewpoint of ensuring the bonding between the substrate and the film, it is conceivable to increase a pressing force during the thermocompression bonding. On the other hand, in case that the pressing force is increased, the bottom portion and the film of the shallow recess is likely to be bonded.

It is an object of the present invention to provide a manufacturing method making it possible to manufacture a laminate including a substrate having a recess and a film with a high yield.

Solution to Problem

A method of manufacturing a laminate of the present invention includes: preparing a substrate having a recess; disposing a film on the substrate so as to cover the recess; and obtaining a laminate by thermocompression bonding between the film and the substrate by pressing the film and the substrate with a first elastic body and a second elastic body in a state in which the substrate on which the film is disposed is disposed between the first elastic body and the second elastic body such that the film is on the first elastic body side, in which the first elastic body is harder than the second elastic body.

Advantageous Effects of Invention

According to the present invention, a laminate including a substrate having a recess and a film can be manufactured with a high yield.

DESCRIPTION OF EMBODIMENTS

Hereinafter, the present invention will be described in detail with reference to the accompanying drawings. In the following description, a method of manufacturing a channel device (channel chip) as an example of a laminate will be described, but the present invention is not limited thereto.

Laminate

The laminate manufactured by the manufacturing method of the present invention is, for example, a channel device (channel chip). The channel device (channel chip) has a channel for allowing a fluid to flow therethrough, a container for containing the fluid, and the like. The laminate is not particularly limited in its structure as long as it includes a substrate and a film. The substrate has a recess that can be a part of the channel and the container, and a pressure-bonding surface to which the film disposed around the recess is pressure bonded. The film is pressure bonded to the pressure-bonding surface of the substrate.

The "fluid" described above is a gas, a liquid, or the like having fluidity, and may contain a single component, or may contain a plurality of components. Further, the fluid may be a solid component dispersed in a solvent or the like. Further, the fluid may also be a droplet or the like dispersed in a solvent, the droplet being not compatible with the solvent.

Figure 1A:
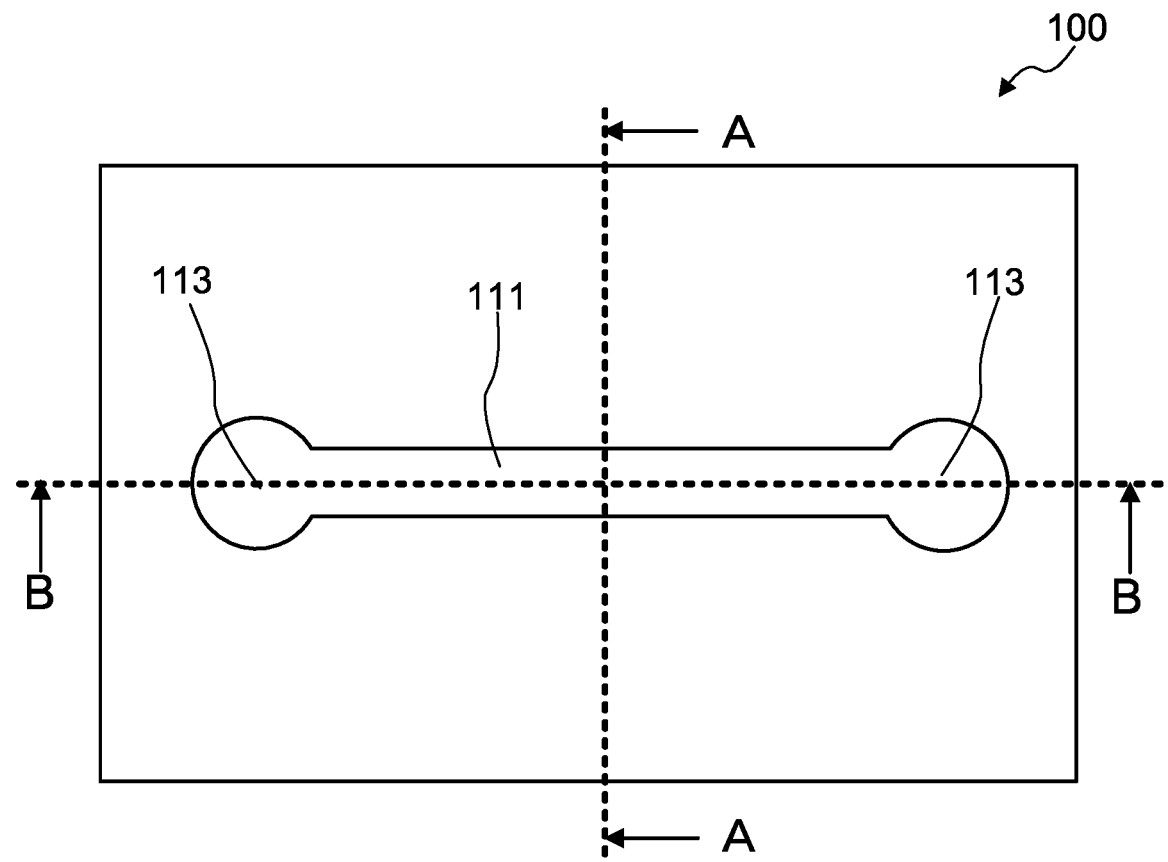
FIG. 1A is a plan view of an exemplary channel device manufactured by a method of manufacturing a laminate of the present invention.
Figure 1B:
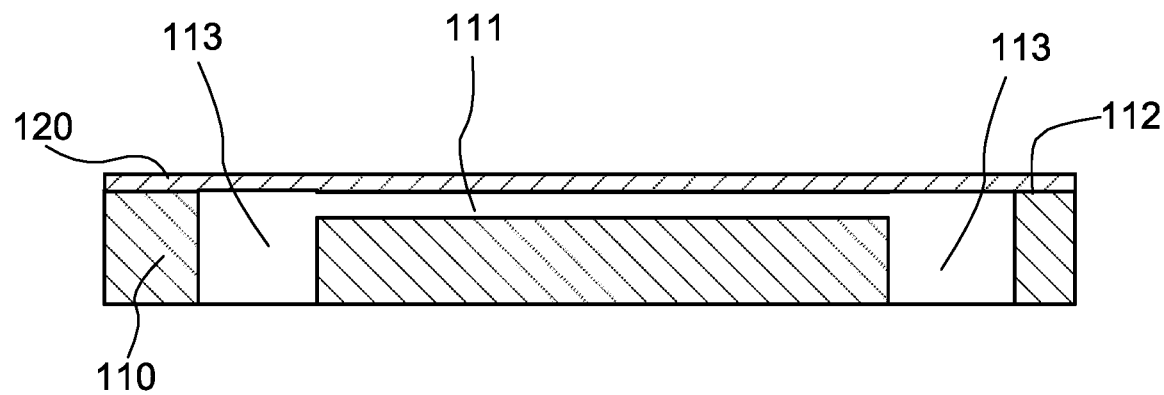
FIG. 1B is a sectional view taken along line B-B in FIG. 1A.

FIG. 1 illustrates one example of laminate 100 manufactured by the method of manufacturing a laminate of the present invention. FIG. 1 is a sectional view of one example of the laminate. Note that, this figure schematically illustrates one example of the structure of the laminate manufactured by the method of the present invention, and the laminate manufactured by the method described later is not limited to this structure.

Figure 2:
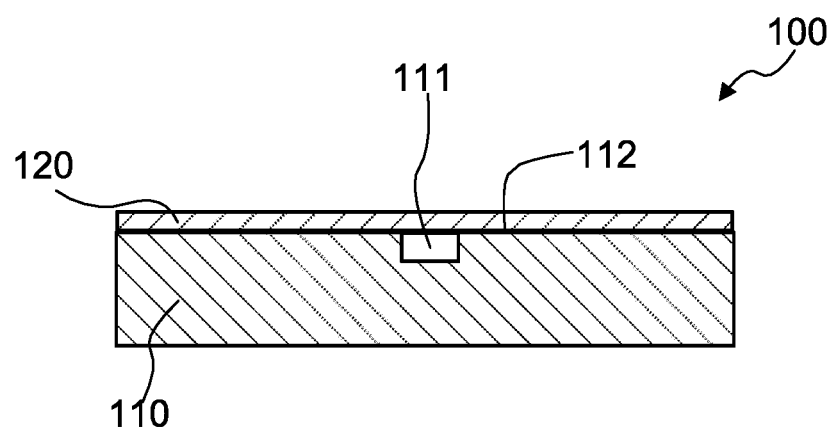
FIG. 2 is a cross-sectional view taken along line A-A in FIG. 1A.

Laminate 100 includes substrate 110 and film 120. Substrate 110 has recess 111 formed in one surface of the substrate. Substrate 110 also has through holes 113. Also, as illustrated in FIG. 2, substrate 110 has pressure-bonding surface 112 disposed around recess 111. In the present embodiment, substrate 110 is a resin mold, more specifically, a resin mold formed by injection molding.

In laminate 100, a region surrounded by recess 111 and film 120 serves as the channel The region surrounded by recess 111 and film 120 may also serve as the container. Further, a region surrounded by one of through holes 113 and film 120 serves as a fluid inlet or a fluid outlet.

Here, the shape of recess 111 in substrate 110 is not limited to a linear shape. Recess 111 may be cylindrical to contain a fluid. When recess 111 contains a fluid, the shape and size thereof are appropriately selected according to the amount and type of the contained fluid. Substrate 110 may also have a plurality of recesses 111 of different depths. Further, the number of containers that substrate 110 has is not limited to two, and may be only one, or may be three or more. Further, the width and depth of recess 111 may be of any width and depth as long as the recess can allow the fluid to flow sufficiently, and are appropriately selected in accordance with the type of the fluid and the application of laminate 100. Note that, in case that laminate 100 having shallow recess 111 is manufactured in a conventional manner, film 120 is pressure bonded to the bottom surface of recess 111 at the time of thermocompression bonding of film 120, and sometimes blocks the channel In contrast, when the laminate is manufactured by the manufacturing method of the present invention described later, blockage or the like is unlikely to occur in the channel.

In general, the shallower the depth of recess 111 and the larger an opening of recess 111, the more likely the bottom surface of the recess and film 120 are pressure bonded to each other. That is, the smaller the aspect ratio of recess 111, the more likely the bottom portion of recess 111 and film 120 are pressure bonded to each other. However, the manufacture by the manufacturing method of the present invention as described above suppresses such pressure bonding. In the present invention, the depth of recess 111 is not particularly limited, but the depth of recess 111 may be, for example, about 5 to 200 μm. Further, although the aspect ratio is not particularly limited, the aspect ratio may be, for example, 1 or less. Here, the aspect ratio is the depth of recess 111 with respect to the length of recess 111 in the direction perpendicular to the depth direction of the recess (the depth of the recess/the width of the recess). Specifically, in case that laminate 100 includes the channel as in the present embodiment, the aspect ratio is the depth of the channel (the depth of recess 111) with respect to the width of the channel (the width of recess 111, the width of the channel in the cross section) as illustrated in FIG. 2. In case that the width of the channel varies, the aspect ratio is the depth of the channel with respect to the maximum width of the channel In case that there are the channel and another recess (a container such as a chamber) connected thereto, the aspect ratios of the channel and of the other recess are separately obtained. In addition, at any point in recess 111, when the aspect ratios (the depth of the recess/the width of the recess) in all the sections (sections in all the 360° directions) of recess 111 that pass through the point and extend along the depth direction of recess 111 are 1 or less, the aspect ratio of such recess 111 may be determined to be 1 or less. Even in case that the aspect ratio is 1 or less as described above, the present invention makes it possible to suppress pressure bonding between film 120 and the bottom portion of recess 111.

Here, although recess 111 is a linear groove in substrate 110 illustrated in FIG. 1, recess 111 may be a curved groove.

In addition, recess 111 may have a cylindrical shape, a rectangular parallelepiped shape, or the like for serving as the container, instead of being the groove serving as the channel as described above. Further, when recess 111 is a groove, the number of the grooves is not limited to one, and may be two or more. Further, while in FIG. 1A, recess 111 communicates with two through holes 113, recess 111 may communicate with only one of them.

Substrate 110 is made of resin. Examples of the resin forming substrate 110 include polyesters such as polyethylene terephthalate; polycarbonate; acrylic resins such as polymethylmethacrylate; polyvinyl chloride; polyesters such as polyethylene terephthalate; polycarbonate; acrylic resins such as polymethylmethacrylate; polyvinyl chloride; polyolefins such as polyethylene, polypropylene, and cycloolefin resins; polyethers; polystyrenes; silicone resins; various elastomers; and the like.

Film 120 may be optically transparent or does not have to be optically transparent. For example, when the fluid in recess 111 is observed through film 120, it is preferable to select the material of film 120 so that film 120 is optically transparent. However, when the fluid is observed through substrate 110, or when observation of the fluid is not performed, or in other cases, film 120 does not need to be optically transparent.

Further, the thickness of film 120 is not particularly limited, and is appropriately selected according to the application of laminate 100. The thickness may be, for example, 0.01 mm or more and 1 mm or less.

Film 120 is also made of resin. It is preferable that the resin forming film 120 is a resin that is not to be eroded by the fluid to be introduced. Examples of the resin forming film 120 include polyesters such as polyethylene terephthalate; polycarbonate; acrylic resins such as polymethylmethacrylate; polyvinyl chloride; polyolefins such as polyethylene, polypropylene, and cycloolefin resins; polyethers; polystyrene; silicone resins; and various elastomers.

Method of Manufacturing Laminate

Figure 3:
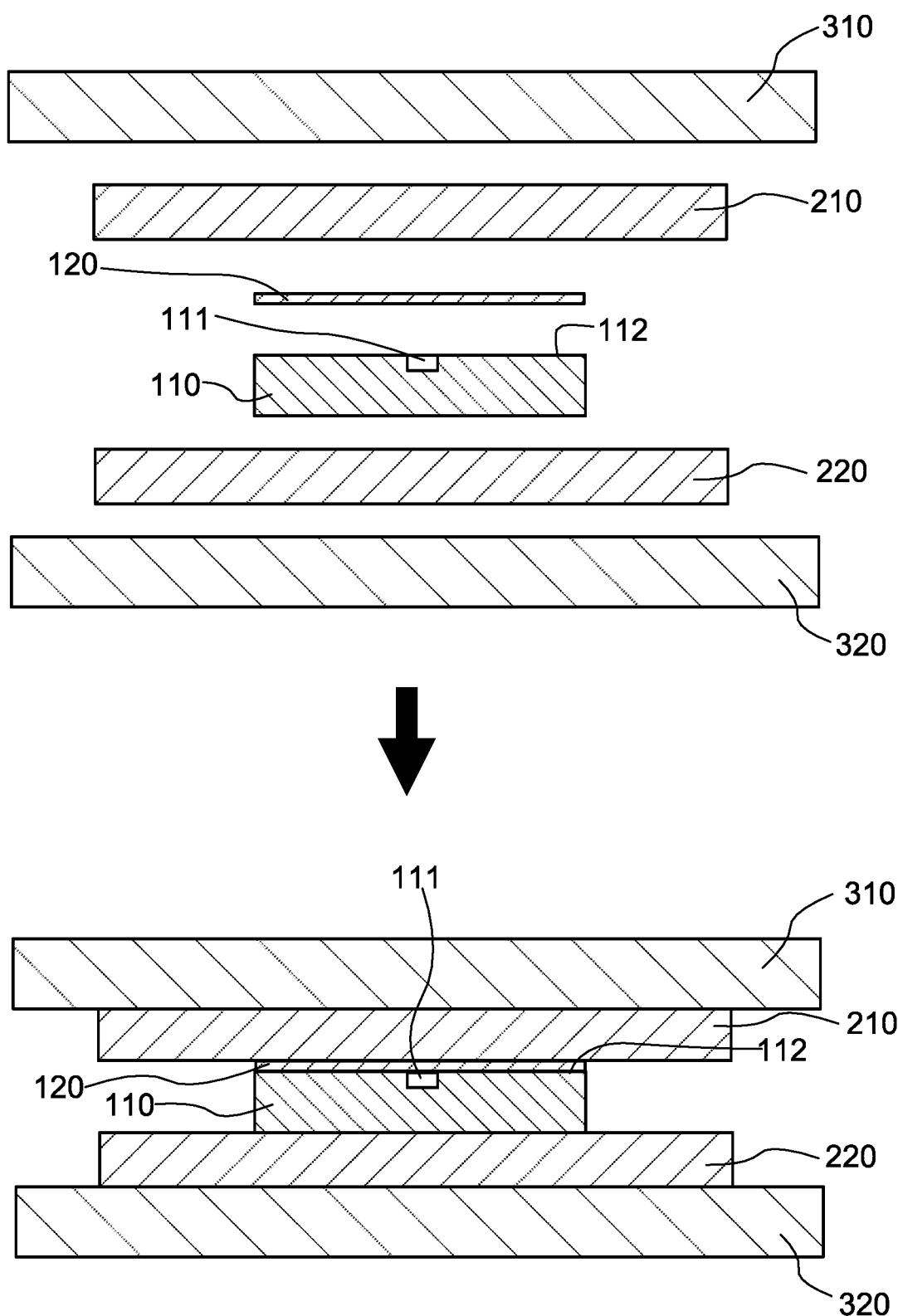
FIG. 3 is a cross-sectional view illustrating one example of the method of manufacturing a laminate of the present invention.

The method of manufacturing a laminate according to an embodiment of the present invention will be described with reference to FIG. 3. FIG. 3 is an explanatory view for explaining the method of manufacturing a laminate with reference to a cross-sectional view.

In the method of manufacturing the laminate of the present embodiment, substrate 110 having recess 111 is prepared as illustrated in FIG. 3. Pressure-bonding surface 112 is disposed around recess 111.

Then, as illustrated at an upper figure in FIG. 3, film 120 is disposed so as to cover recess 111 in substrate 110.

Next, thermocompression-bonding between film 120 and substrate 110 is performed by pressing film 120 and substrate 110 with first elastic body 210 and second elastic body 220 in a state where substrate 110 on which film 120 is disposed is disposed between first elastic body 210 and second elastic body 220 such that film 120 is on the first elastic body 210 side. As a result, a laminate is obtained.

Specifically, as illustrated at a lower figure in FIG. 3, film 120 and substrate 110 are sandwiched under heat between first elastic body 210 and second elastic body 220 using first pressing member 310 and second pressing member 320 so as to pressure bond the film and the substrate.

Here, the hardness of second elastic body 220 is less than that of first elastic body 210. Thus, according to the manufacturing method of the present invention, the laminate can be manufactured with a high yield. The reason therefor is estimated as follows.

In general, substrate 110 obtained by injection molding or the like is not flat due to waviness, sink, and/or the like. This waviness and/or sink occur not only in the surface of substrate 110 on the front side (the surface in which recess 111 is formed) but also in the surface on the back side. In order to cope with the waviness and sink in both sides of substrate 110, elastic bodies 210 and 220 are disposed on both sides of substrate 110, and substrate 110 and film 120 are sandwiched between two elastic bodies 210 and 220, to perform thermocompression bonding between substrate 110 and film 120 in the manufacturing method of the present invention. First elastic body 210 disposed to face the front side of substrate 110 makes it possible to appropriately press film 120 to substrate 110 while suppressing the influence of waviness and sink present on the front side of substrate 110. Similarly, second elastic body 220 disposed to face the back side of substrate 110 makes it possible to appropriately press substrate 110 to film 120 while suppressing the influence of waviness and sink present on the back side of substrate 110. In a case where first elastic body 210 is disposed without disposing second elastic body 220, there is a possibility that substrate 110 and film 120 cannot be properly bonded to each other when waviness or sink exists on the back side of substrate 110.

As described above, from the viewpoint of suppressing the influence of waviness and sink present on both surfaces of substrate 110, it is preferable that both of first elastic body 210 and second elastic body 220 be soft. On the other hand, in case that first elastic body 210 is soft, first elastic body 210 is deformed during thermocompression bonding and may push film 120 to the bottom portion of recess 111 in substrate 110. To avoid this, in the manufacturing method of the present invention, although elastic bodies 210 and 220 are disposed on both sides of substrate 110, the hardness of first elastic body 210 is made greater than the hardness of second elastic body 220 from the viewpoint of preventing the bonding between the bottom portion of recess 111 in substrate 110 and film 120. Consequently, according to the manufacturing method of the present invention, it is estimated that film 120 is prevented from being bonded to the bottom portion of recess 111 in substrate 110 while film 120 is sufficiently bonded to substrate 110 by uniformly applying pressure to substrate 110 and film 120 at the time of thermocompression bonding, and the yield of the laminate is increased. It should be noted that the above effects are based on estimation and should not be construed as limiting the scope of the present invention.

The hardness of first elastic body 210 is not particularly limited as long as it is less than the hardness of substrate 110 and greater than the hardness of second elastic body 220.

Examples of the material of first elastic body 210 include resins, elastomers, metals, and the like.

The thickness of first elastic body 210 may be appropriately set in accordance with the depth of the recess in substrate 110, the degree of unevenness of pressure-bonding surface 112, and the like, and is not particularly limited.

FIG. 2 illustrates that first elastic body 210 and film 120 make direct contact with each other, but depending on the hardness (elasticity) of first elastic body 210, a sheet having a hardness greater than that of first elastic body 210 may be interposed between first elastic body 210 and film 120. In case that the hardness of first elastic body 210 is too small, such a sheet can prevent bonding between film 120 and the bottom portion of recess 111. Examples of such a sheet include metal sheets.

The hardness of second elastic body 220 is not particularly limited as long as it is smaller than the hardness of substrate 110 and smaller than the hardness of first elastic body 210.

Examples of the material of the second elastic body include resins, elastomers, metals, and the like.

The thickness of second elastic body 220 is not particularly limited as long as it is appropriately set in accordance with the degree of unevenness of the surface of substrate 110 opposite to the surface of the substrate having the recess.

The configuration of first pressing member 310 is not particularly limited as long as it can directly or indirectly press first elastic body 210. It is preferable that first pressing member 310 be larger than first elastic body 210 so as to be capable of pressing the entire surface the first elastic body.

Although first pressing member 310 is illustrated in FIG. 2 as being a member separate from first elastic body 210, first pressing member 310 may be integrated with first elastic body 210, or first elastic body 210 itself may be first pressing member 310.

The configuration of second pressing member 320 is not particularly limited as long as it can directly or indirectly press second elastic body 220. It is preferable that second pressing member 320 be larger than second elastic body 220 so as to be capable of pressing the entire surface of the second elastic body.

Although second pressing member 320 is illustrated in FIG. 2 as being a member separate from second elastic body 220, second pressing member 320 may be integrated with second elastic body 220, or second elastic body 220 itself may be second pressing member 320.

A mode in which substrate 110 and film 120 are pressed by first pressing member 310 and second pressing member 320 is not particularly limited. In the mode of pressing, first pressing member 310 may be fixed and second pressing member 320 may move toward first pressing member 310, or conversely, second pressing member 320 may be fixed and first pressing member 310 may move toward second pressing member 320. Both of first pressing member 310 and second pressing member 320 may move to sandwich substrate 110 and film 120.

Pressure exerted by first pressing member 310 and second pressing member 320 may be appropriately set in accordance with the materials of substrate 110 and film 120 and the temperature or the like during thermocompression bonding, and is not particularly limited.

Example

Table 1 below illustrates an outline of effects obtained in an Example according to the manufacturing method of the present invention as compared with comparative examples.

TABLE 1

|  | First elastic body | Second elastic body | Yield of laminate |
|---|---|---|---|
| Example | Slightly soft material | Highly soft material | High |
| Comparative Example 1 | Metal | Metal | Low |
| Comparative Example 2 | Soft material | Metal | Medium |

In the Example, the first elastic body harder than the second elastic body was used. On the other hand, in Comparative Examples 1 and 2, the first elastic body softer than the second elastic body was used.

As can be seen in Table 1, in the Example, the yield of the laminate was higher than in the Comparative Examples. This is considered to be because, by employing the second elastic body on the side of the substrate opposite to the side having the recess, the second elastic body (highly soft material) absorbs the waviness or the like of the opposite side, bringing about an equal pressing force, and accordingly, thermocompression bonding becomes possible even at a relatively low temperature and with a low pressing force. Further, the high yield is considered to be because, by employing the first elastic body (slightly soft material) on the side of the substrate having the recess, the film is not pressure bonded to the bottom portion of the recess.

In the laminates of the Example and Comparative Examples 1 and 2, the material of the substrate was a resin, the depth of the recess was at a point of 200 μm or below, and the aspect ratio of the recess was at a point of 1 or below. In addition, in the laminates of the Example and Comparative Examples 1 and 2, the material of the film was a resin.

The evaluation of the yield was conducted as follows. That is, the case where the film is bonded to the bottom portion of the recess and/or the case where the film is not bonded to the end portion of the recess on the opening side were regarded as defective. When the rate of occurrence of defects is extremely low (less than 10%), the yield was expressed as "high"; when defects occur in about 10% to 30%, the yield was expressed as "medium"; and when defects occur in 30% or more, the yield was expressed as "low."

Effects

According to the method of manufacturing the laminate according to the present embodiment, by disposing the relatively hard first elastic body on the side of the substrate having the recess and disposing the relatively soft second elastic body on the opposite side, it is possible to appropriately bond the substrate and the film while preventing the bonding between the bottom portion of the recess in the substrate and the film.

INDUSTRIAL APPLICABILITY

The method of manufacturing a laminate according to the present invention is useful for manufacturing a channel device used in various applications such as clinical tests, food tests, and environmental tests, for example.

REFERENCE SIGNS LIST

100 Laminate
110 Substrate
111 Recess
111a First recess
111b Second recess
111c Third recess
112 Pressure-bonding surface
113 Through hole
120 Film
210 First elastic body
220 Second elastic body
310 First pressing member
320 Second pressing member

The invention claimed is:

1. A method of manufacturing a laminate, the method comprising:
   preparing a substrate having a recess;
   disposing a film on the substrate so as to cover the recess; and
   obtaining a laminate by thermocompression bonding between the film and the substrate by pressing the film and the substrate with a first elastic body and a second elastic body in a state in which the substrate on which the film is disposed is disposed between the first elastic body and the second elastic body such that the film is on a first elastic body side, wherein
   the first elastic body is harder than the second elastic body, and
   the substrate is a resin mold obtained by injection molding.

2. The method of manufacturing a laminate according to claim 1, wherein, in the obtaining the laminate, the thermocompression bonding between the film and the substrate is performed in a state in which a sheet harder than the first elastic body is disposed between the first elastic body and the film.

3. The method of manufacturing a laminate according to claim 2, wherein the sheet is a metal sheet.

4. The method of manufacturing a laminate according to claim 1, wherein the substrate comprises the recess having an aspect ratio of 1 or less.

5. The method of manufacturing a laminate according to claim 1, wherein the laminate is a channel device.

* * * * *